United States Patent [19]

Spangler et al.

[11] Patent Number: 4,928,033

[45] Date of Patent: May 22, 1990

[54] THERMIONIC IONIZATION SOURCE

[75] Inventors: Glenn E. Spangler, Lutherville; John P. Carrico, Jr., Laurel; Donald N. Campbell, Timonium, all of Md.

[73] Assignee: Environmental Technologies Group, Inc., Baltimore, Md.

[21] Appl. No.: 272,231

[22] Filed: Nov. 15, 1988

[51] Int. Cl.[5] .......................... H01J 1/02; H01J 27/26; H01J 37/08

[52] U.S. Cl. .................................. 313/345; 250/423 R

[58] Field of Search .................. 313/359.1, 362.1, 345, 313/346 R; 250/423 R, 424

[56] References Cited

U.S. PATENT DOCUMENTS 4,774,413 9/1988 Okubo et al. .................. 250/423 R
4,783,595 11/1988 Seidl ................................ 250/423 R

*Primary Examiner*—Kenneth Wieder
*Attorney, Agent, or Firm*—Leonard Bloom

[57] ABSTRACT

A thermionic emitter for providing positive ions has been described incorporating a mixture of beta-alumina and inert material such as charcoal positioned on a filament for heating the mixture. Alternately the invention may incorporate beta-alumina with inert material such as nickle deposited in selected areas. The invention overcomes the problem of generating positive ions with low power consumption.

8 Claims, 1 Drawing Sheet

THERMIONIC IONIZATION SOURCE

GOVERNMENT CONTRACT

The government has rights in this invention pursuant to contract no. DAAK11-82-C-0122 with the Department of the Army.

CROSS REFERENCE TO A RELATED APPLICATION

Cross reference is made to U.S. application Ser. No. 701,898, filed on Feb. 15, 1985, now U.S. Pat. No. 4,839,143 entitled "Selective Ionization of Gas Constituents Using Electrolytic Reactions" by K. N. Vora et al. and assigned to the assignee herein and directed to an electrolytic ionization source using inorganic/organic salts which react with sample molecules to form product ions. The electrolytic ionization source is selective and may be used, for example, in an ion mobility spectrometer, an ionization detector and a mass spectrometer.

BACKGROUND OF THE INVENTION

1. Field of the Invention

This invention relates to thermionic emitters and more particularly to positive ion emitters for use in instruments such as ion mobility spectrometers.

2. Description of the Prior Art

U.S Pat. No. 2,742,585 which issued on Apr. 17, 1956 to P. D. Zemany describes an electrical vapor detector. A thin refractory coating a few mills thick of specific metal oxides act both as insulators and alkali ion emitters at temperatures ranging from about 700° C. to 1200°-1300° C. or higher. The refractory coating may be oxides of aluminum (alumina), titanium (titania), beryllium (beryllia), thorium (thoria), magnesium (magnesia), calcium, molybdenum, iron, manganese, silicon, cobalt, nickle and the rare earths (the rare earths have atomic numbers 57 to 71, inclusive). In operation, at a temperature above 700° C. the initial ion current from the refractory coating subsides; the device is then prepared to detect vapors of halogens and their compounds in a vacuum system of 1 mm Hg. The admission of the vapors of halogens and their compounds to the surface of the refractory coating causes an increase in the positive ion current collected upon the negatively charged collector. The electrical vapor detector detects halogens and their compounds due to an increase in evaporation of alkali ions from the surface of the coating.

In U.S. Pat. No. 2,806,991 which issued on Sept. 17, 1957 to W. P. White, an electrical detector is described for the detection of certain substances or impurities in gases. The detector comprises a double helical wire heater winding wound on a cylindral ceramic core which has been impregnated with a solution of sodium hydroxide. An electrode inserted into tight fitting holes in the ceramic core which act as the cold electrode. The ceramic core must be impregnated with a highly conductive salt such as NaOH, NaF, or LiCl. The vapor dectector is particularly adapted to detect the presence of hydrogen, in flammable gases, reducing gases, or vapors containing hydrogen.

In U.S. Pat. No. 3,972,480 which issued on Aug. 3, 1976 to R. W. Powers, a method of preparing a suspension of additive-free beta-alumina particles is described.

In U.S. Pat. No. 4,166,009 which issued on Aug. 28, 1979 to D. J. Fray, a method for the determination of impurities of specific elements in solid or moltent metal or alloys is described by monitoring the e.m.f. generated between the substance and a reference material. The reference material may be a solid electrolyte comprising beta-alumina containing an element or a solid compound of the element to be detected. A beta-alumina pellet for the probe is formed in situ in one end of an alpha-alumina tube by a hot pressing technique. Sodium aluminate ($NaAl_2O_3$) and alpha-$Al_2O_3$ powder are well mixed and heated together in air at 1,400° C. after which the mixture is ground to a powder. A carbon rod with a diameter of the internal diameter of the tube is used to cold press the powder at 25 Kg/$cm_2$ and the load is maintained while the powder is heated to a temperature of 1,150° C. The load and temperature are subsequently increased. Most of the carbon rod is then drilled out of the alpha-$Al_2O_3$ tube and the remainder is burnt out using a small oxygen lance, the high temperatures reached during this burning operation help to harden the pellet.

In U.S. Pat. No. 4,499,054 which issued Feb. 12, 1985 to M. Katsura et al, a halogenated hydrocarbon gas detecting element is described comprising a cation source consisting of essentially of beta-alumina, a heater and an ion collector electrode. In the presence of a halogenated gas, the emission of $Na^+$ ions is increased due to surface interactions. The $Na^+$ ions are then attracted to the collector electrode by a voltage. In Katsura et al, an increase in the emission of $Na^+$ ions is observed at times halogenated hydrocarbons and present near the surface of the beta-alumina.

SUMMARY OF THE INVENTION

In accordance with the present invention, a thermionic emitter for providing positive ions is provided comprising a mixture of beta-alumina and an inert material, each having portions thereof exposed to the surface of said mixture, said exposed inert material portions providing surface sites characterized by a high work function to enhance the emission of positive ions and a heater such as a filament positioned to heat the mixture to a predetermined temperature.

A method for making the thermionic emitter is also described comprising the steps of grinding inert material such as beta-alumina to form a powder grinding charcoal to form a powder, mixing the beta-alumina, and inert material powders together, adding an inorganic binder such as sodium silicate and water, and heating the mixture over time to a temperature such as 300° C. to form a solid body or a coating having an outer surface with portions or sites of beta alumina and inert material exposed.

DESCRIPTION OF THE PREFERRED EMBODIMENTS

Figure 1:
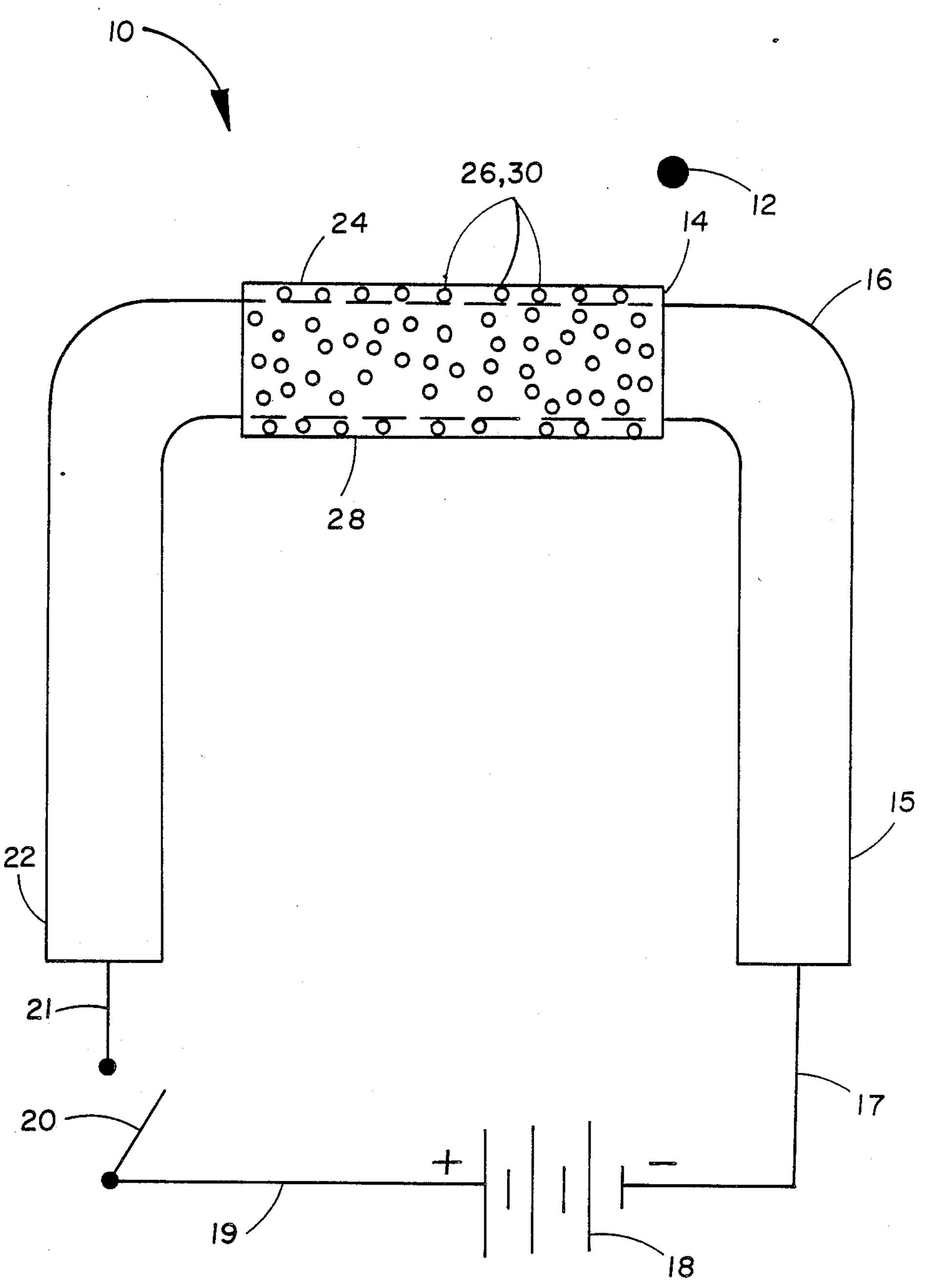
FIG. 1 is one embodiment of the invention.

Referring to FIG. 1, a thermionic emitter 10 is shown for emitting ions into a gaseous environment 12. Thermionic emitter 10 may include a coating 14 over a filament wire 16 which may be resistive, for example, a wire made of nickle and chromium to provide heat and a predetermined temperature to coating 14 at times a current is passed through filament wire 16. End 15 of filament wire 16 is coupled over lead 17 to the positive terminal of battery 18. The negative terminal of battery 18 is coupled over lead 19 to one side of switch 20 which may be a single pole single throw switch. The other side of switch 20 is coupled over lead 21 to end 22 of filament 16. At times switch 20 is closed, battery 18 supplies current over leads 19 and 17 to filament 16 to heat coating 14 to a predetermined temperature.

Coating 14 may be a mixture of beta-alumina 24 and an inert material 26, for example, glass chips, charcoal, diatomacious earth, ceramic powder, silica powder, and alumina powder. Beta-alumina 24 may be expressed by the chemical formula $Na_2O.5Al_2O_3$. Beta-alumina functions to supply alkali ions, for example, sodium in coating 14 and at its surface 28. Beta-alumina may be purchased from Ceramatech, Inc. located at 2425 South 900 West, Salt Lake City, Utah 84119. Coating 14 may be prepared by grinding beta-alumina into a fine powder, for example, 80–100 mesh and mixing the beta-alumina powder with sodium silicate, water and inert material which also has been ground up. The proportions excluding the inert material may be 40.98% beta-alumina, 1.93% sodium silicate and 57.6% water. In place of sodium silicate, other inorganic binders may be used. The mixture forms a paste which may be applied to filament 16 to an approximate thickness of 1 mm and cured by gradually heating the filament from 100° C. for 2 hours to 200° C. for two hours to 300° C. over night. Sources prepared in this matter provided sodium ions by ion emission when sufficient power (0.6 to 20 watts) is applied to filament 16 to heat coating 14 to 600°-1000° K.

In operation, coating 14 provides Na ion emission sodium atoms by giving up electrons to the filament 16. The sodium ions migrate through the lattice structure of the beta-alumina 24 to surface 28. Thermal emission of the sodium ions into the gaseous environment 12 occurs from surface 28 of coating 14.

The energetics for thermionic emission, is given by the Saha-Langmuir equation and involves a free energy change expressed in Equation (1)

$$-(\Phi+e(eE)^{\frac{1}{2}}-I(A)-D(AX)) \quad (1)$$

where Φ is the average work function (i.e. the energy needed to remove an electron) from the emitting surface 28, E is the electric field which exists at surface 28, I(A) is the ionization potential for the alkali atom A, and D(AX) is the dissociation energy required to cleave bonds between the alkali atom and surface 28. Since emission from surface 28 is enhanced when the free energy is large and negative (i.e. exothermic), a higher work function for emitting surface 28 is desired. Inert material 26 which is chemically inert provides sites on surface 28 with a higher work function adjacent the beta-alumina surface with the result that the surface of inert material 26 will more freely emit positive ions than the surface of beta-alumina. Alkali metal ions on the surface of beta-alumina lowers the work function of the surface of beta-alumina.

With inert material 26 dispersed on surface 28, the temperature of filament 16 and surface 28 may be lowered with surface 28 emitting adequate or a saturated stream of alkali ions. It is noted that in the older thermionic sources, alkali ion emission was dependent on the rate of diffusion of the ions through the solid material to the surface. By using beta-alumina for alkali ion emission, sodium ions may move through vacancies in the latice structure to the surface 28 and therefore provide an endless supply of sodium ions. Inert material 26 provides a plurality of surface sites 30 for emission which are dispersed over surface 28.

An alternate method for providing surface sites 30 of an inert material 26 may be by vapor deposition of an inert material through a mask onto surface 28, for example, the inert material 26 may be a metal vapor depositer such a nickle.

One example of an inert material which has been tried experimentally, is charcoal which has been ground up and mixed with the original mixture of beta-alumina, sodium silicate and water: The range of charcoal may vary from 0–100% in coating 14. By using 10% charcoal in coating 14, it was found that coating 14 required less power for ion emission and that coating 14 was a source of primarily potassium cations. The reduced power is believed to be due not only to the higher work function of carbon surface sites 30 but also to the lower ionization potential of potassium. The potassium cation is believed to arise from impurities in the charcoal and results in more ions of potassium than sodium being emitted simultaneously.

Thermionic emitter 10 may be used in an ion mobility spectrometer to provide alkali ions as reactant ion in the reaction region to react with the sample ions to be detected. One example of an ion mobility spectrometer is described in U.S. Pat. No. 4,712,008 which issued on Dec. 8, 1987 to K. N. Vora et al and assigned to the Environmental Analytical Systems, Inc. which name has been changed to Environmental Technologies Group, Inc. which is incorporated herein by a reference. The thermionic emitter 10 may be placed in a reaction region 74 shown in FIG. 2 of U.S. Pat. No. 4,712,008 with the radioactive ion source, foil 83, removed.

Reference is made to a publication entitled "IMS/MS STUDIES ON CHEMICAL WARFARE AGENTS USING ALKALI REACTANT CATIONS," by G. E. Spangler, S. H. Kim, J. Epstein, D. N. Campbell, J. P. Carrico, Jr., Environmental Analytical Systems, Inc. which name has been changed to Environmental Technologies Group, Inc., 1400 Taylor Avenue, Baltimore, Md. 21284-9840, published Nov. 15, 1988 at Chemical Research and Development Engineering Center (CRDEC), Edgewood, Md., which describes a thermionic source and its experimental use in an Ion Mobility Spectrometer/Mass Spectrometer which is incorporated herein by reference.

A thermionic emitter has been described for providing a continuous flow of positive ions comprising a mixture of beta alumina and inert material, for example, charcoal, the beta-alumina and inert material have portions thereof exposed on the surface of the mixture, the exposed inert material portions form surface sites characterized by a high work function for the emission of positive ions and a heater for heating the mixture to a predetermined temperature which may be, for example, a resistive filament wire and a source of electrical power.

What is claimed is:

1. A thermionic emitter for providing positive ions comprising:
   - a mixture of beta alumina and inert material,
   - said beta alumina and inert material having portions thereof exposed on the surface of said mixture,
   - said exposed inert material portions providing surface sites characterized by a high work function for the emission of positive ions, and means for heating said mixture to a predetermined temperature.

2. The thermionic emitter of claim 1 wherein said inert material is charcoal.

3. The thermionic emitter of claim 1 wherein said inert material is diatomaceous earth.

4. The thermionic emitter of claim 1 wherein said inert material is glass powder chips.

5. The thermionic emitter of claim 1 wherein said inert material is silica.

6. A thermionic emitter for providing positive ions comprising:

beta-alumina material having an exposed surface, an inert material deposited on portions of said exposed surface of said beta-alumia to provide surface sites of inert material, said surface sites of inert material characterized by a high work function for the emission of positive ions, and means for heating said beta-alumina and said inert material to a predetermined temperature.

7. The thermionic emitter of claim 6 wherein said inert material is nickle.

8. The thermionic emitter of claim 6 wherein said inert material is a metal.

* * * * *